United States Patent
Kotani et al.

(10) Patent No.: US 8,212,271 B2
(45) Date of Patent: Jul. 3, 2012

(54) SUBSTRATE FOR MOUNTING AN OPTICAL SEMICONDUCTOR ELEMENT, MANUFACTURING METHOD THEREOF, AN OPTICAL SEMICONDUCTOR DEVICE, AND MANUFACTURING METHOD THEREOF

(75) Inventors: Hayato Kotani, Tsukuba (JP); Naoyuki Urasaki, Chikusei (JP); Makoto Mizutani, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 257 days.

(21) Appl. No.: 12/209,544

(22) Filed: Sep. 12, 2008

(65) Prior Publication Data

US 2009/0095969 A1    Apr. 16, 2009

(30) Foreign Application Priority Data

Oct. 11, 2007   (JP) ................. P2007-265558
Jun. 11, 2008   (JP) ................. P2008-152649

(51) Int. Cl.
*H01L 33/00*    (2010.01)

(52) U.S. Cl. .......... 257/98; 257/E33.07; 438/27; 438/29

(58) Field of Classification Search ..................... 257/98, 257/E33.057; 438/27
See application file for complete search history.

(56) References Cited

U.S. PATENT DOCUMENTS 7,521,724 B2 *   4/2009   Chen et al. ..................... 257/95

FOREIGN PATENT DOCUMENTS

| JP | 2006-140207 |   | 6/2006 |   |
|----|-------------|---|--------|---|
| JP | 2006140207 A | * | 6/2006 | ..................... 257/81 |
| JP | 2007-142253 |   | 6/2007 |   |

* cited by examiner

*Primary Examiner* — Stephen W Smoot
*Assistant Examiner* — Vicki B Booker
(74) *Attorney, Agent, or Firm* — Antonelli, Terry, Stout & Kraus, LLP.

(57) ABSTRACT

A substrate for mounting optical semiconductor elements is provided, including a base substrate having an insulating layer and a plurality of wiring circuits formed on the upper face of the insulating layer, and having at least one external connection terminal formation opening portion which penetrates the insulating layer and reaches the wiring circuits; and an optical reflection member, which is provided on the upper face of the base substrate, and which forms at least one depressed portion serving as an area for mounting an optical semiconductor element.

13 Claims, 7 Drawing Sheets

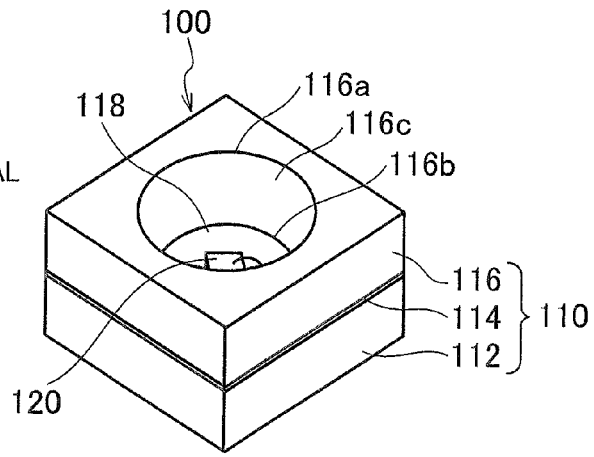
FIG. 1
CONVENTIONAL
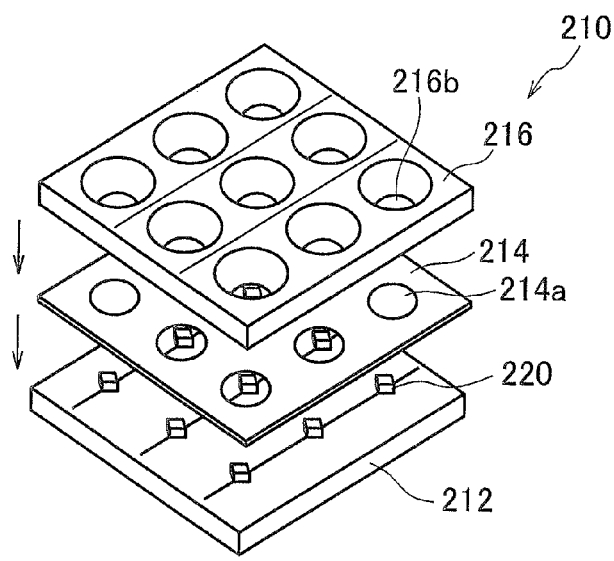
FIG. 2A
CONVENTIONAL
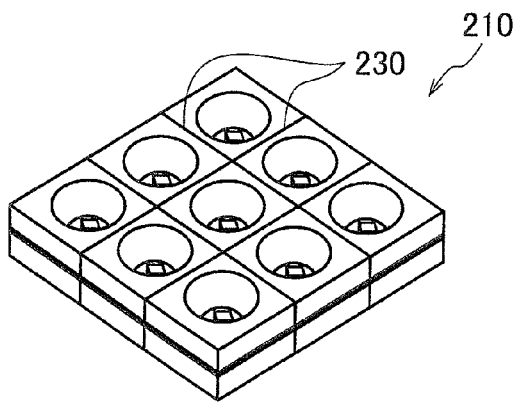
FIG. 2B
CONVENTIONAL

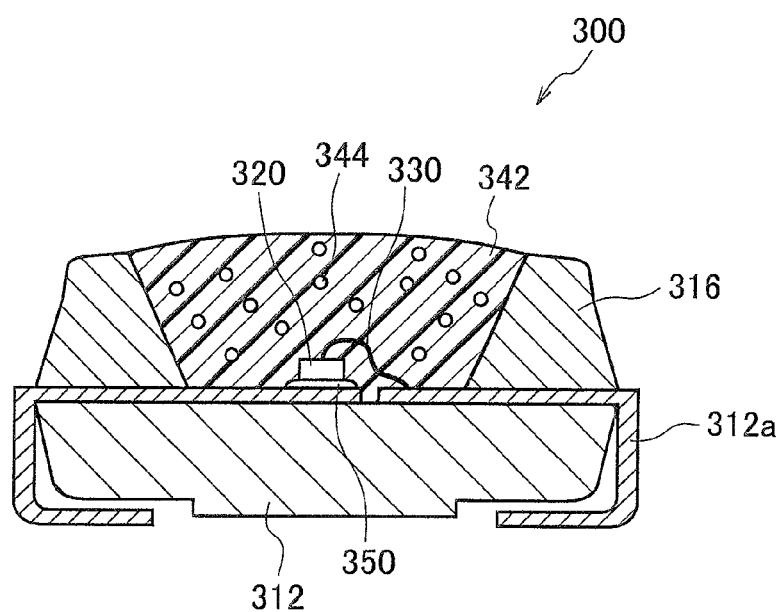
FIG. 3  BACKGROUND

SUBSTRATE FOR MOUNTING AN OPTICAL SEMICONDUCTOR ELEMENT, MANUFACTURING METHOD THEREOF, AN OPTICAL SEMICONDUCTOR DEVICE, AND MANUFACTURING METHOD THEREOF

CROSS-REFERENCE TO RELATED APPLICATIONS

This application claims priority based on Japanese Patent Application No. 2007-265558, previously filed by this applicant on Oct. 11, 2007, and based on Japanese Patent Application No. 2008-152649, previously filed by this applicant on Jun. 11, 2008, and incorporates these specifications into the present specification by reference.

BACKGROUND OF THE INVENTION

1. Field of the Invention

The present invention relates to a substrate for mounting an optical semiconductor element, a manufacturing method thereof, an optical semiconductor device using such a substrate, and a method of manufacturing an optical semiconductor device.

2. Description of the Related Art

In recent years, in addition to reductions in size and weight, there have been advances in the performance and multifunctionality in the field of electronic equipment, and electronic components have come to be mounted at high densities in electronic equipment. What are called SMDs (Surface Mount Devices), which can be mounted on the surface of print boards, have come to be the mainstream of electronic components used in electronic equipment; SMDs can be connected to wiring patterns on print boards by reflow soldering and other methods, and are used in various applications.

For example, SMD type LEDs (Light-Emitting Diodes) are electronic components used in the field of optical semiconductors. LEDs are optical semiconductor devices which combine optical semiconductor elements and fluorescent materials, and are attracting attention as light-emitting devices which are energy-efficient and have long lifetimes. In recent years there has been vigorous research and development of optical semiconductor elements relating to increasing the brightness, boosting the output, and shortening the emission wavelength, among other performance enhancements; and great hopes are being placed on LEDs as next-generation light sources.

General SMD-type LEDs are explained using FIG. 1. FIG. 1 is a perspective view showing an example of the structure of a conventional SMD-type LED. As shown in FIG. 1, the SMD-type LED 100 substantially comprises an LED package substrate 110, and an optical semiconductor element 120 mounted in a depressed portion thereof. The LED package substrate 110 comprises a metal substrate 112, and a resin substrate 116 provided thereupon with an adhesive sheet 114 intervening. On the upper face of the metal substrate 112 is formed a pair of connection terminals (not shown) for electrical connection to each of the electrodes of the optical semiconductor element 120; the surfaces of the electrodes are treated with silver plating or similar.

The resin substrate 116 is configured so as to function as a reflector, and in the center portion thereof is formed a penetrating hole 118, comprising a circular upper opening 116a and lower opening 116b as well as an inner wall 116c. The penetrating hole 118 forms a cup-shape depressed portion as a result of connection of the resin substrate 116 with the metal substrate 112 with the adhesive sheet 114 intervening. The portion of the adhesive sheet 114 corresponding to the lower opening 116b is removed.

Next, an example of a method of manufacture of a SMD-type LED is explained. FIG. 2A and FIG. 2B are summary diagrams explaining processes in a conventional method of manufacturing an LED package in which a plurality of optical semiconductor elements are arranged in a matrix. By means of such a method, a plurality of LEDs can be manufactured at one time.

In the specific processes, as shown in FIG. 2A, an LED package substrate 210 is manufactured by applying pressure and heat to a resin substrate 216 serving as a reflector and bonding this onto a metal substrate 212 on which are mounted in advance at prescribed positions optical semiconductor elements 220, with an adhesive sheet 214 in which opening portions 214a have been provided in advance, intervening. The positions of the opening portions 214a of the adhesive sheet 214 correspond to the positions of the lower openings 216b of the resin substrate 216. The LED package substrate 210 obtained in this way is then cut into individual LEDs along dicing lines 230 in two directions, as shown in FIG. 2B, to finally obtain SMD-type LEDs 100 as shown in FIG. 1.

In the above-described SMD-type LED, as the performance of the optical semiconductor element is enhanced, there is a tendency for the heat and optical energy generated by the element itself to increase. The heat generated by the optical semiconductor element causes the temperature of the optical semiconductor element and the optical semiconductor device to rise. In particular, as shown in FIG. 3, in the case of an SMD-type LED 300 which employs an insert-type lead frame as the base member, lead terminals are mounted on a device side face as electrical external connection terminals. In the figure, the reference number 312 denotes a metal substrate, 312a is the lead frame, 316 is a reflector, 320 is the optical semiconductor element, 330 is a wire bonding wire, 342 is a transparent sealing resin, 344 is a fluorescent material, and 350 is a die bond material. In such an SMD-type LED, particularly when no measures are taken to deal with heat, the path for dissipation of heat generated by the optical semiconductor element 320, which is surrounded by the transparent sealing resin 342 having poor thermal conductivity, extends to the lead frame 312a and the external electrodes (not shown) connected to the lead frame. Hence because the distance from the light-emitting element which is the heat source to the external electrodes is long, thermal resistance is high, and due to this structure, increases in the temperature of the optical semiconductor element are unavoidable.

Increases in the temperature of the optical semiconductor element cause degradation of the optical semiconductor element, and induce reduced brightness, shortened lifetimes, and other declines in the performance and reliability of the optical semiconductor device, and so are undesirable. As methods to suppress increases in temperature, materials with high thermal conductivity may be used in the substrate on which the device is mounted or in constituents of the optical semiconductor device, or members may be designed to have structures which reduce thermal resistance. However, when a heat sink or metal/ceramic package with high thermal conductivity or similar are used as members employing materials with high thermal conductivity, the overall number of components as well as the number of manufacturing processes are increased, which tend to increase costs and detract from manufacturing productivity.

Given such circumstances, methods have been disclosed in which a thermoplastic resin with excellent heat dissipation, heat resistance, ultraviolet light resistance, and other characteristics is used to form, by various methods, the reflector portion, that is "depressed portion", in the substrate for mounting an optical semiconductor element.

In Laid-open Japanese Patent No. 2006-140207, a method is disclosed for manufacture of a substrate for mounting optical semiconductor element, in which a specific thermosetting resin compound for optical reflection, having heat resistance and light resistance, is used to form a reflector portion by a transfer molding method. An optical semiconductor element mounting substrate manufactured according to the method disclosed has good adhesion to a wiring board formed from a resin composition, and has excellent reliability due to the minimal occurrence of warping caused by the resin composition.

Further, in Laid-open Japanese Patent No. 2007-142253, a method is disclosed in which, in manufacturing a wiring board for a light-emitting element, a reflector portion is formed directly by molding, without the intervention of an adhesive layer, on a fiber-containing resin board on which is formed a wiring pattern, to manufacture a molded board.

According to the above-described method, a depressed portion, which becomes the area for mounting optical semiconductor element, can be molded integrally with a printed circuit board. However, when this board is formed as a large molded object of size 20 mm$^2$ or larger, in which are arranged a plurality of optical semiconductor elements in a matrix as shown in FIG. 2A and FIG. 2B, differences in linear expansion rates give rise to stress-induced warping, and it becomes difficult to execute subsequent processes, among other problems. Also, when forming a depressed portion by transfer molding of a resin composition, resin burrs may occur at the lead terminal surface or other external connection terminal portions, and there is a strong possibility that a process to remove such burrs must be added. Further, there is a tendency for resin to be not sufficiently filled between circuit wires in circuits in which optical semiconductor elements and external connection elements are arranged in a complex manner for electric input. If resin is not sufficiently filled between circuit wires and thereby unfilled portions of resin exist, when subsequently filling the depressed portion with transparent sealing resin, transparent resin may leak from the unfilled portions, so that filling faults may occur, and execution of subsequent manufacturing processes becomes difficult.

Hence it has been deemed necessary to perform further development related to materials comprised by members of optical semiconductor mounting boards, optical semiconductor devices and similar, as well as to design of member structures. And hereafter, when manufacturing high-output, high-brightness LEDs, it is anticipated that numerous optical semiconductor elements will be mounted on a substrate. And as the number of mounted optical semiconductor elements increases, the number of external connection terminals for connection of elements to external electrodes must also be increased. Hence a structure for mounting optical semiconductor substrates enabling easy connection of elements to external connection terminals, as well as an efficient and low-cost method of manufacturing such substrates, is desired.

SUMMARY OF THE INVENTION

This invention was devised in light of the above circumstances, and has as an object the provision of a substrate for mounting an optical semiconductor element, with high reflectivity from the visible light range to near-ultraviolet light and with excellent resistance to thermal degradation, as well as a method of manufacturing the optical semiconductor element mounting substrate, as well as an optical semiconductor device using the mounting substrate and a method of manufacturing the optical semiconductor devices.

Characteristics of this invention are described in (1) through (10) below.

(1) A substrate for mounting an optical semiconductor element is characterized in having: a base substrate, comprising an insulating layer and a plurality of wiring circuits formed on the upper face of the insulating layer and having at least one external connection terminal formation opening portion which penetrates the insulating layer and reaches the wiring circuits; and an optical reflection member, which is provided on the upper face of the base substrate, and which forms at least one depressed portion serving as an area for mounting an optical semiconductor element.

(2) The substrate according to (1), characterized in that at least one of the external connection terminal formation opening portions is provided directly below a mounting position of an optical semiconductor element to be mounted in a depressed portion.

(3) The substrate according to the above (1) or (2), characterized in that inner faces of the external connection terminal formation opening portions are covered with a material with high thermal conductivity.

(4) The substrate according to any one among the above (1) through (3), characterized in that an external connection terminal formed in the external connection terminal formation opening portion is any one of a solder ball, solder paste, an electrode pad, and a needle-shape terminal.

(5) An optical semiconductor device, characterized in comprising, at least, the substrate according to any one among the above (1) through (4), an optical semiconductor element mounted in the depressed-portion bottom face of the substrate for mounting an optical semiconductor element, and a fluorescent material-containing transparent sealing resin layer formed within the depressed portion so as to cover the optical semiconductor element.

(6) A method of manufacturing the substrate for mounting an optical semiconductor element according to any one among the above (1) through (4), characterized in comprising the steps of: forming, on a base substrate having an insulating layer and a plurality of wiring circuits formed on the upper face of the insulating layer, at least one external connection terminal formation opening portion, which penetrates the insulating layer and reaches the wiring circuits; and forming an optical reflection member which, on the upper face of the base substrate, forms at least one depressed portion serving as an area for mounting an optical semiconductor element; and further characterized in that at least the inner peripheral face of the optical refection member formed in the depressed portion is formed from a thermosetting optical reflection resin composition which has, as essential components, (A) an epoxy resin, (B) a curing agent, (C) a curing catalyst, (D) an inorganic filler material, and (E) a white pigment.

(7) The method according to the above (6), characterized in that the optical reflection member is integrally molded by transfer molding of the thermosetting optical reflection resin composition onto the upper face of the base substrate having the plurality of wiring circuits.

(8) The method according to the above (7), characterized in that, prior to integral molding of the optical reflection member, a solder resist layer is formed on the plurality of wiring circuits.

(9) A method of manufacturing an optical semiconductor device, characterized in comprising the steps of: mounting at least one optical semiconductor element in a depressed-portion bottom face of the substrate according to any one among the above (1) through (4); and forming a fluorescent material-containing transparent sealing resin layer within the depressed portion so as to cover the optical semiconductor element.

(10) A method of manufacturing an optical semiconductor device, characterized in comprising the steps of: mounting at least one optical semiconductor element in each of depressed portions of the substrate according to any one among the above (1) through (4), the substrate being provided with at least two depressed portions; forming a fluorescent material-containing transparent sealing resin layer in each of the depressed portions so as to cover the optical semiconductor elements; and dividing two or more continuous optical semiconductor devices obtained in the preceding processes into separate optical semiconductor devices.

According to the substrate for mounting optical semiconductor element of this invention, heat dissipated from the optical semiconductor element mounted on the substrate surface is transported to the mounting substrate via the heat conduction path of an external connection terminal on the substrate rear portion, positioned directly below the optical semiconductor element. As a result, increases in temperature of the optical semiconductor element and optical semiconductor device are suppressed, and the reliability of the optical semiconductor device can be enhanced. Moreover, according to a method for manufacturing the optical semiconductor element mounting substrate and a method of for manufacturing an optical semiconductor device of this invention, manufacturing processes in such method can be simplified, so that productivity can be enhanced and costs can be lowered.

BRIEF DESCRIPTION OF THE DRAWINGS

FIG. 1 is a perspective view showing an example of the structure of a conventional SMD-type LED;

FIG. 2A is a summary view explaining a process in a conventional method to manufacture an LED package;

FIG. 2B is a summary view explaining a process in a conventional method to manufacture an LED package;

FIG. 3 is a side cross-sectional view showing an example of an SMD-type LED structure employing an insert-type lead frame as a base member;

DESCRIPTION OF THE PREFERRED EMBODIMENTS

Below, the invention is explained in detail.

Figure 4A:
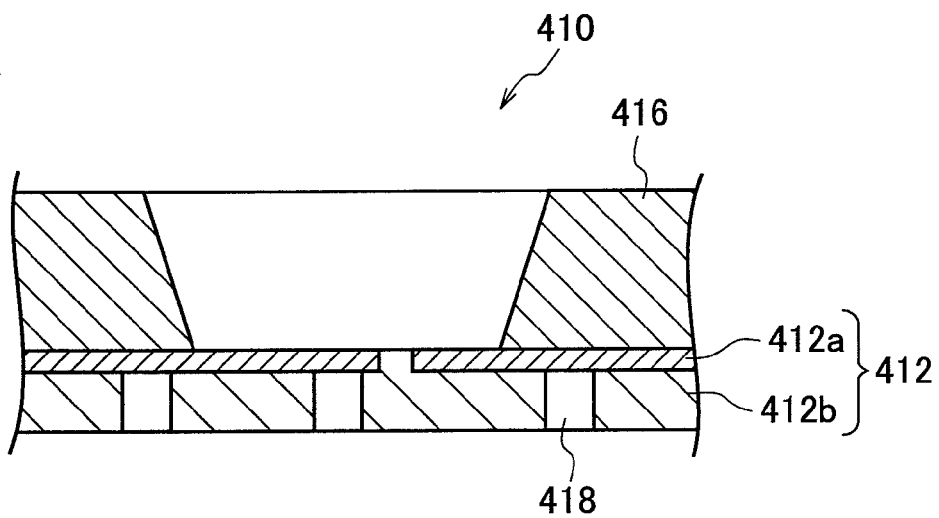
FIG. 4A is a partial enlarged view of a side cross-section showing schematically one embodiment of an optical semiconductor element mounting substrate of the invention.
Figure 4B:
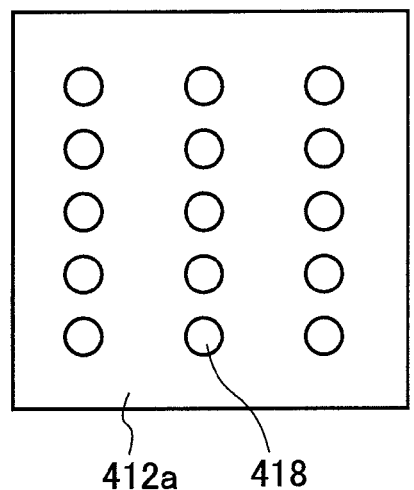
FIG. 4B is a rear view showing schematically one embodiment of an optical semiconductor element mounting substrate of the invention.

FIG. 4A is a partial enlarged view of a side cross-section showing schematically one embodiment of an optical semiconductor element mounting substrate of the invention. FIG. 4B is a rear view showing schematically one embodiment of an optical semiconductor element mounting substrate of the invention. As shown in FIG. 4A, the substrate 410 for mounting an optical semiconductor element of the invention comprises a base member 412 comprising a plurality of wiring circuits 412a and an insulating layer 412b, and an optical reflection member (reflector) 416, positioned on the upper face of the base member 412, and forming at least one depressed portion to serve as an area for mounting an optical semiconductor element; a characteristic is that at least one external connection terminal formation opening 418, penetrating the insulating layer 412b on the lower-face side of the base member 412 and reaching the wiring circuits 412a, is provided. The substrate of this invention enables easy mounting on the mounting substrate by providing external connection terminals for connection of external electrodes to the external connection electrode formation opening 418. And, the external connection terminal provided on the substrate rear face as shown in FIG. 4B serves as a heat conduction path, so that heat generated from the substrate can be transferred to the mounting substrate. Hence compared with a case in which an insert-type lead frame is used as a base member (see FIG. 3), the heat conduction path is shortened, and thermal resistance can be lowered.

Figure 5A:
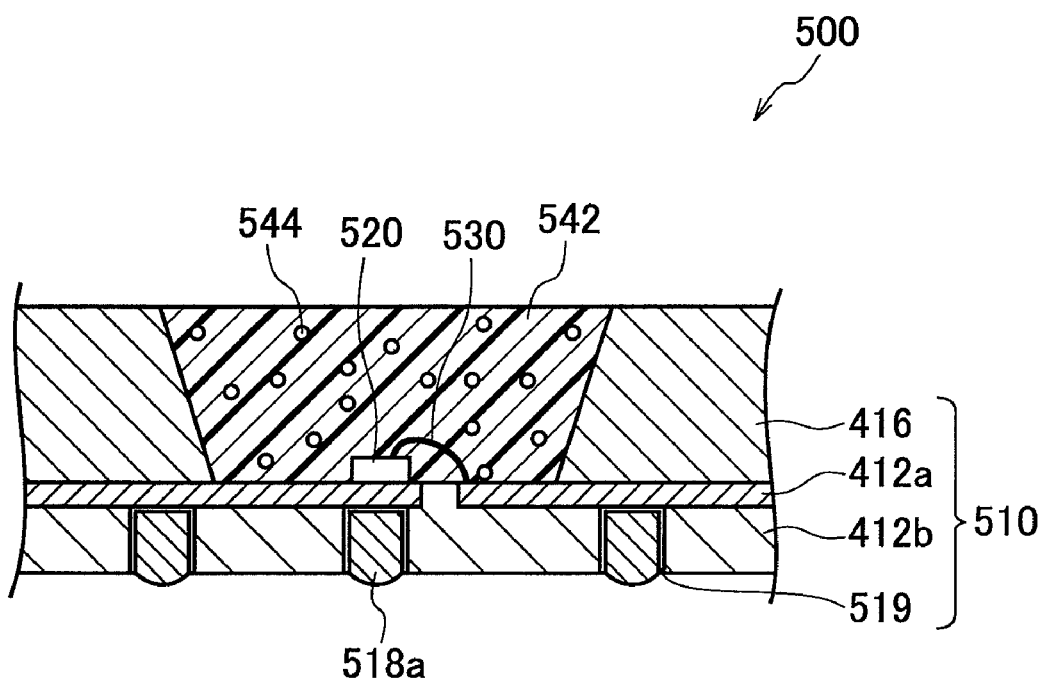
FIG. 5A is a partial enlarged view of a side cross-section showing schematically one embodiment of an optical semiconductor device of the invention.

In an optical semiconductor element mounting substrate of the invention, the distance between the optical semiconductor element and an external electrode is minimized, and from the standpoint of reducing thermal resistance, it is preferable that the opening for external connection terminal formation provided in the substrate rear surface be formed directly below the position at which the optical semiconductor element is mounted. Further, after formation of the opening for external connection terminal formation, it is preferable that the inner face of the opening be plated with copper or another material with high thermal conductivity. A substrate for mounting an optical semiconductor element in such one embodiment corresponds to FIG. 5A, explained below. In FIG. 5A, reference symbol 520 denotes the optical semiconductor element, 519 is the plated layer of the material with high thermal conductivity provided on the inner face of the opening for external connection terminal formation, and 518*a* is a solder ball provided in the opening portion as an external connection terminal.

As shown in FIG. 5A, by performing plating of the inner face of the opening with a high-thermal-conductivity material, heat from the optical semiconductor element at a high temperature can be efficiently dissipated in the thickness direction of the substrate for mounting an optical semiconductor element, that is, on the rear-face side of the mounting substrate. The position of installation of the opening need not be directly below the optical semiconductor element, and openings may be provided in a plurality of other places. By providing openings in a plurality of places, the thermal resistance value can be further lowered. Below, principal elements in the configuration of the mounting substrate of this invention are explained.

Figure 4C:
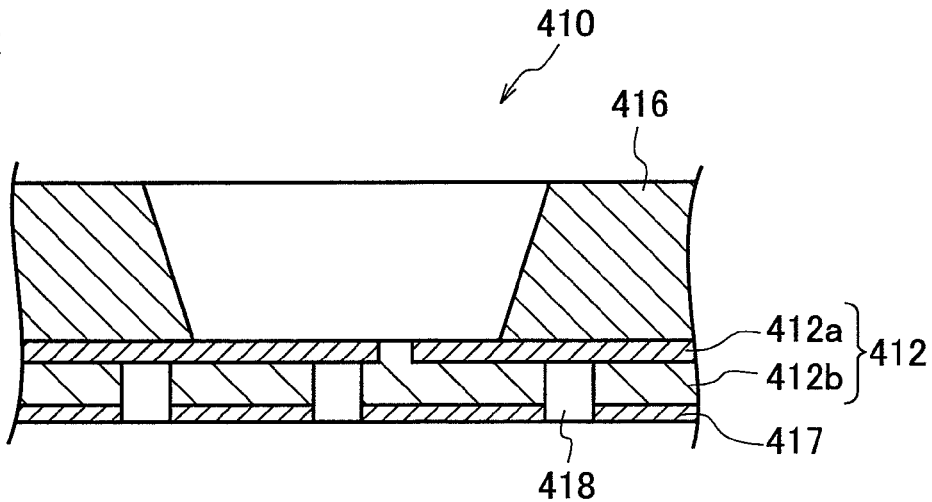
FIG. 4C is a partial enlarged view of a side cross-section showing schematically one embodiment of an optical semiconductor element mounting substrate of the invention.

A based substrate used in the mounting substrate of this invention is obtained by forming a plurality of wiring circuits on an insulating layer. No limitations in particular are placed on the wiring circuits, but it is desirable that circuits comprise copper, 42 alloy, or another metal, with Ni/Au, Ni/Ag, Ni/Pb/flash Au, Ni/Pd, or another material plated on the surface thereof. No limitations in particular are placed on the method of formation of the wiring circuits, and a subtraction method which employs a normal etching liquid for copper foil, or a method in which an electroplating method is used to form wiring circuits on metal foil, and by burying the foil on a member onto which an insulating resin has been applied, the wiring circuits are transferred, after which the metal foil is selectively stripped away or removed, can be employed. Also, wiring circuits can be formed by printing methods and the other methods such as photographic methods. On the other hand, no limitations in particular are placed on the method of formation of an insulating layer, and for example a solder resist or another insulating material can be used in formation according to a printing method, photographic method, or other well-known method. The insulating layer is not limited to a single-layer structure, and a multilayer structure in which an additional insulating layer is added as necessary may be used. As shown in FIG. 4C, still another additional insulating layer (reference symbol 417) may be deposited onto the insulating layer (reference symbol 412*b*) of the base member as necessary.

While no limitations in particular are imposed, as the base substrate of this invention, at least one among the printed circuit board, lead frame, flexible wiring board, and metal base wiring board described below can be used.

Printed circuit board: A printed circuit board is obtained by using a glass-reinforced resin board comprising copper foil for wiring circuit formation, using well-known techniques to form wiring circuits, and then providing resin for insulation on the wiring circuits. It is desirable that the resin used for circuit insulation and the resin used in the glass-reinforced resin board each is a white insulating resin, so as to be able to efficiently reflect light from the LED element.

Lead frame: A lead frame can be obtained using a substrate comprising copper, 42 alloy or similar, employing a well-known technique to form wiring circuits. It is desirable that the substrate surface be plated with a material such as Ni/Au, Ni/Ag, Ni/Pb/flash Au, Ni/Pd, or similar, such that light from the LED element can be efficiently reflected.

Flexible wiring board: A flexible wiring board is obtained by using a polyimide board provided with copper foil for wiring circuit formation, and after using a well-known technique to form wiring circuits, providing a resin for insulation on the wiring circuits. It is desirable that the resin for circuit insulation be a white insulating resin, so as to be able to efficiently reflect light from the LED element.

Metal base wiring board: A metal base wiring board is obtained by forming an insulating layer on a metal substrate formed from copper or aluminum, then using a well-known technique to form circuits, and then providing a resin for insulation on the circuits. It is desirable that the insulating layer on the metal substrate and the resin for circuit insulation be a white insulating resin, so as to be able to efficiently reflect light from the LED element.

An opening for forming an external connection terminal is formed by opening a hole in the insulating layer. No limitations in particular are placed on the specific method of formation of the opening, but methods which can be employed include for example (1) a method of providing a penetrating hole in the insulating layer by means of well-known drill or punch processing, and then applying heat and pressure to copper foil on one face of the insulating layer to block one side of the penetrating hole; (2) a method of applying heat and pressure to copper foil on one face of the insulating layer, then directly forming a non-penetrating hole by means of a carbon dioxide gas laser or similar until the copper foil is reached; and, (3) a method of applying heat and pressure to copper foil on both faces of the insulating layer, then removing one copper foil by etching, and directly forming a non-penetrating hole similarly to (2). When applying methods (2) and (3), processing of copper foil to form the opening may be performed before processing copper foil for wiring circuit formation and forming the base substrate, or may be performed after processing copper foil for wiring circuit formation and forming the base substrate.

It is preferable that an opening for external connection terminal formation be plated with a high-thermal-conductivity material. It is preferable that all of the inside faces of the opening, including the bottom portion and side faces, be treated with the high-thermal-conductivity material, so that the wiring circuits on the base substrate surface and the mounting substrate electrode can easily be connected via the external connection terminal. Specific examples of high-thermal-conductivity materials include copper, aluminum, iron, steel, lead, silver, gold, and metal alloys of these. Plating can be performed by for example electroplating, chemical plating, or any other well-known plating method.

No limitations in particular are imposed on an external connection terminal formed in an opening for external connection terminal formation, so long as the bottom portion of the external connection terminal formation opening and the mounting board can be electrically connected. For example, well-known methods employing a solder ball, solder paste, a pin, an electrode pad, a needle-shape terminal, or similar may be used for terminal formation. From the standpoint of heat dissipation characteristics, it is preferable that the external connection terminal be formed as a solder ball with good thermal conductivity. No limitations in particular are placed on such a high-thermal conductivity solder ball, but a copper ball, obtained by coating a copper core with lead-free solder, may be used. In FIG. 5A, an example is shown in which a solder ball 518*a* is provided as an external connection terminal in an opening for external connection terminal formation.

On the wiring circuit of the base substrate is formed an optical reflection member. The optical reflection member is formed in a shape having at least one opening, such that at least one depressed portion serving as an area for mounting an optical semiconductor element is formed on the base substrate. Such an optical reflection member can for example be formed from a thermosetting optical reflection resin composition. The method of formation of the optical reflection member is explained in detail in the method of substrate manufacture described below.

Figure 5B:
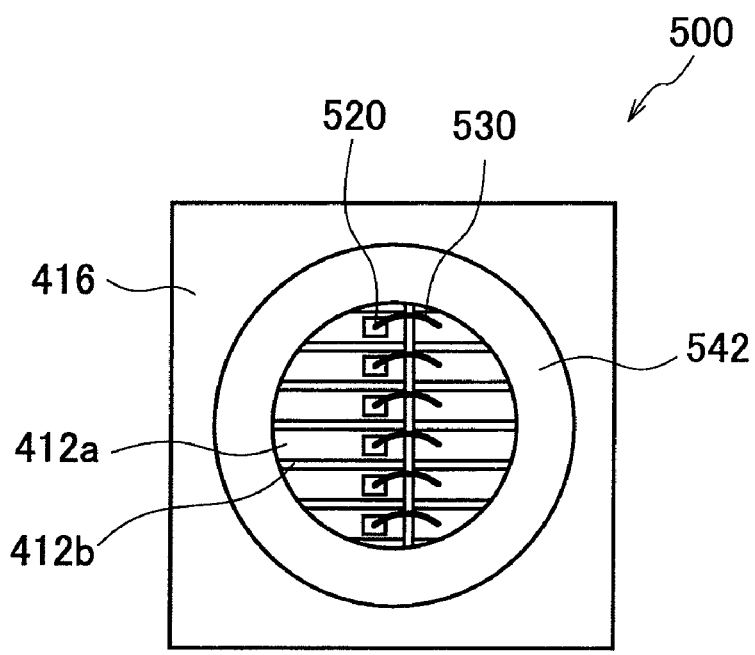
FIG. 5B is a plane view showing schematically one embodiment of an optical semiconductor device of the invention.

FIG. 5A is a partial enlarged view of a side cross-section showing schematically one embodiment of an optical semiconductor device of the invention. And FIG. 5B is a plane view showing schematically one embodiment of an optical semiconductor device of the invention. As shown in FIG. 5A, an optical semiconductor device 500 of this invention is characterized in comprising, at least, the above-described substrate 510 for mounting optical semiconductor element; an optical semiconductor element 520 mounted on the bottom face of the depressed portion of the substrate; and a fluorescent material-containing transparent sealing resin layer formed within the depressed portion of the substrate so as to cover the optical semiconductor element 520. The fluorescent material-containing transparent resin can be formed using a transparent sealing resin 542 containing a fluorescent material 544. In such an optical semiconductor device, openings for external connection terminals are provided in the rear face of the substrate for mounting optical semiconductor element, corresponding to the number of optical semiconductor elements mounted in depressed portions and to the mounting positions. In FIG. 5B, an example is shown in which six optical semiconductor elements are mounted in one depressed portion of a substrate; but not limitations are placed on the number of mounted optical semiconductor elements or their arrangement.

Figure 6A:
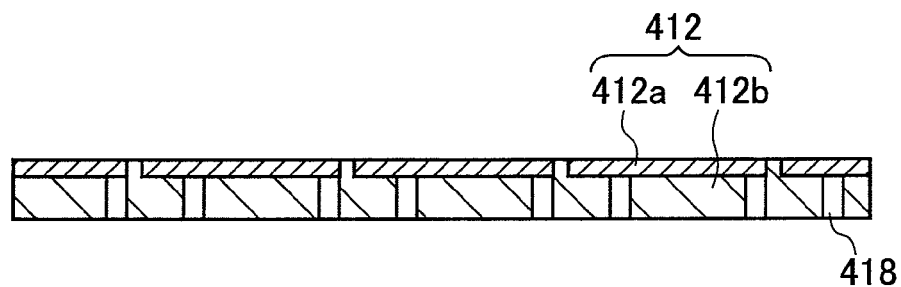
FIG. 6A is a schematic cross-sectional view used to explain a process in one embodiment of a method of manufacture of an optical semiconductor element mounting substrate of the invention.
Figure 6B:
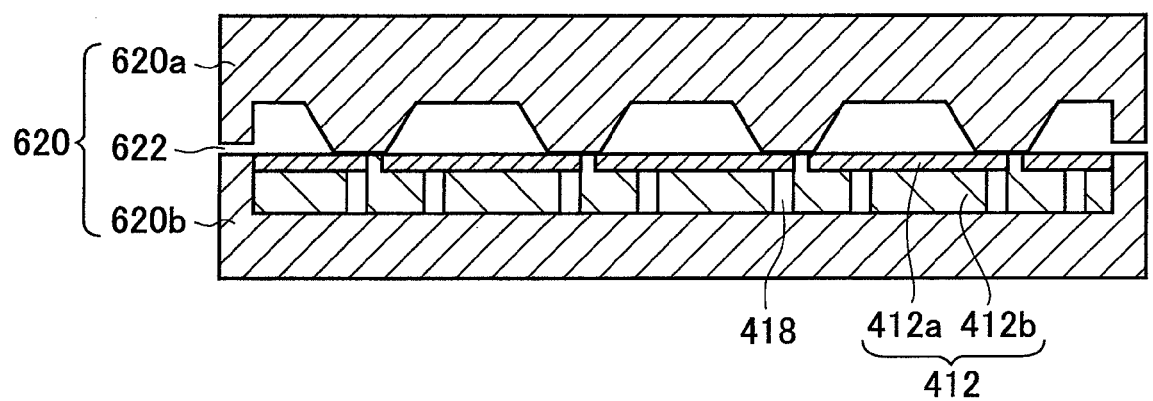
FIG. 6B is a schematic cross-sectional view used to explain a process in one embodiment of a method of manufacturing an optical semiconductor element mounting substrate of the invention.
Figure 6C:
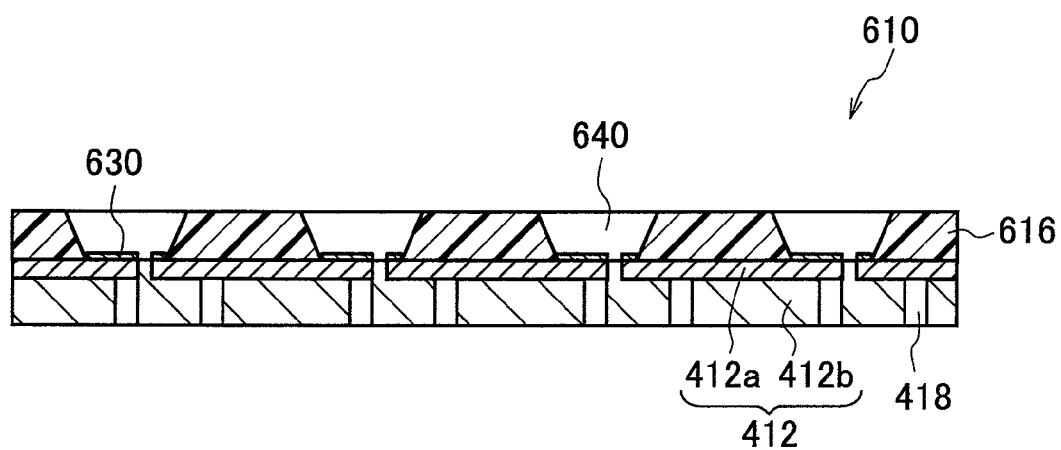
FIG. 6C is a schematic cross-sectional view used to explain a process in one embodiment of a method of manufacturing an optical semiconductor element mounting substrate of the invention.

A substrate for mounting an optical semiconductor element of this invention can be manufactured by means of a process of: forming, on a base substrate comprising an insulating layer and a plurality of wiring circuits formed on the upper face of the insulating layer as explained above, at least one opening for external connection terminal formation, penetrating the insulating layer and reaching the wiring circuits; and a process of forming, on the upper face of the base substrate, an optical reflection member which has formed at least one depressed portion serving as an area for mounting optical semiconductor element. FIG. 6A through FIG. 6C are schematic side views used to explain processes in one embodiment of a method of manufacturing an optical semiconductor element mounting substrate of the invention. In the manufacturing method illustrated, first, in the lower face of a base substrate 412 comprising wiring circuits 412a and an insulating layer 412b, a plurality of interlayer connection holes, penetrating the insulating layer 412b and reaching the wiring circuits 412a, are formed as openings 418 for external connection terminal formation. The wiring circuits 412a can be formed in desired shapes by for example etching of copper foil for circuit formation on a printed circuit board as a base substrate, or by another well-known method. Formation of openings 418 is as described above, but may be performed either before or after formation of wiring circuits.

Next, as shown in FIG. 6B, the base substrate 412 having openings 418 provided as described above is positioned in a die 620, comprising an upper die 620a and a lower die 620b, and having a prescribed shape; a resin composition is injected from a resin injection inlet 622 of the die 620, to integrally mold the optical reflection member 616 on the wiring circuits 412a. After injection of the resin composition, it is preferable that the die temperature be held at 170 to 190° C. for 60 to 120 seconds, and that an after-curing temperature of 120 to 180° C. be maintained for 1 to 3 hours to harden the resin composition. After hardening, the die 620 is removed to obtain optical semiconductor element mounting areas (depressed portions) 640 molded with surrounding optical reflection members (reflectors) 616 on the wiring circuits 412a of the base substrate (see FIG. 6C). Finally, as shown in FIG. 6C, by depositing a Ni/silver plating 630 at prescribed positions of the optical semiconductor element mounting areas, that is depressed portions 640, by electroplating, the optical semiconductor element mounting substrate 610 of the invention could be obtained.

Figure 7A:
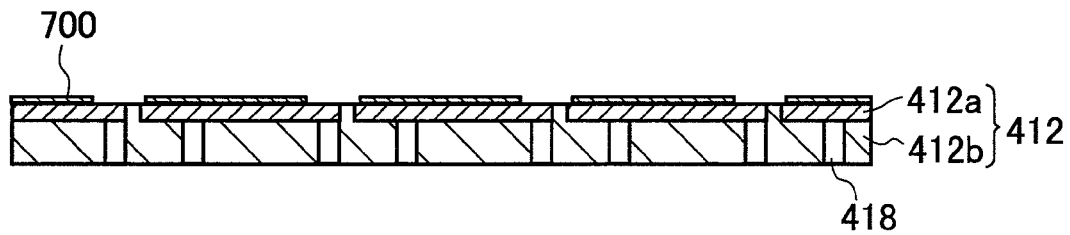
FIG. 7A is a schematic cross-sectional view used to explain a process in one embodiment of a method of manufacturing an optical semiconductor element mounting substrate of the invention.
Figure 7B:
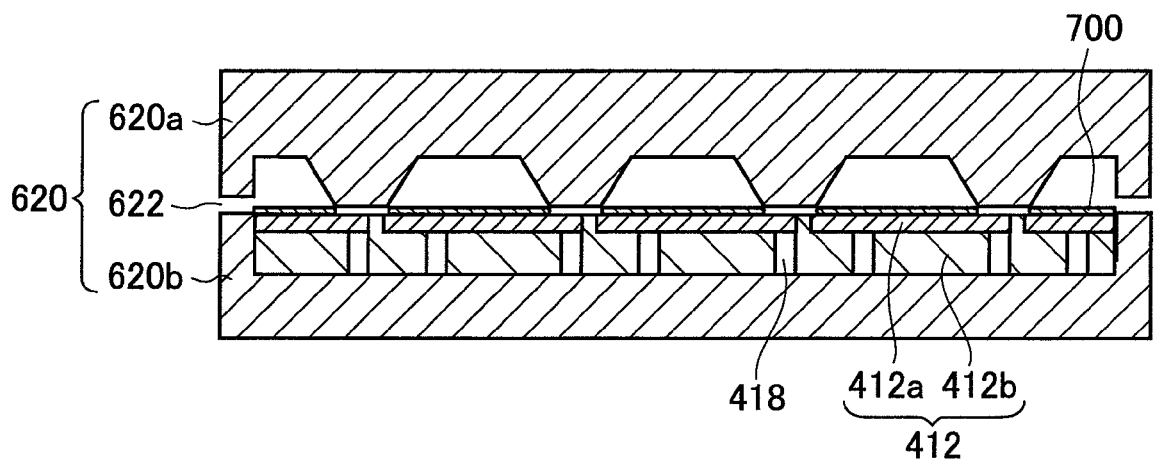
FIG. 7B is a schematic cross-sectional view used to explain a process in one embodiment of a method of manufacturing an optical semiconductor element mounting substrate of the invention.
Figure 7C:
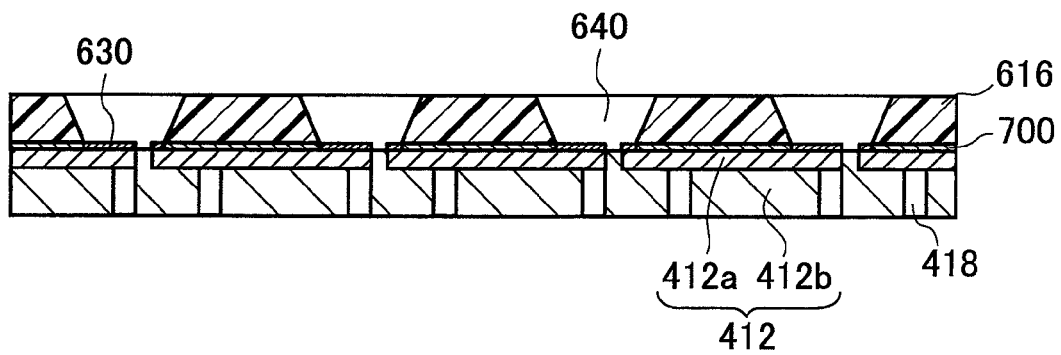
FIG. 7C is a schematic cross-sectional view used to explain a process in one embodiment of a method of manufacturing an optical semiconductor element mounting substrate of the invention; and, FIG. 8 is a perspective view showing one embodiment of an optical semiconductor element mounting substrate applied to a method of manufacturing an optical semiconductor device of this invention.

In the above-described method of manufacturing the mounting substrate of this invention, prior to the integral molding of the optical reflection member corresponding to FIG. 6B, it is preferable that solder resist (layer) for wiring circuit protection be formed on the wiring circuits of the base substrate. A specific explanation of this embodiment follows, based on the drawings. FIG. 7A through FIG. 7C are schematic cross-sectional views used to explain processes in one embodiment of a method of manufacturing the mounting substrate of this invention. In FIG. 7A, in addition to the procedure explained previously based on FIG. 6A, solder resist (layer) 700 for protection of wiring circuits is formed on the wiring circuits 412a. Each of the processes shown in FIG. 7B and FIG. 7C can be executed similarly to the processes explained previously based on FIG. 6B and FIG. 6C. By means of this embodiment, by providing a solder resist layer 700, during transfer molding direct contact between the wiring circuits 412a on the base substrate surface and the die 620 is prevented, and protrusion of resin burrs on the surface of the wiring circuits 412a can be prevented. As a result, the subsequently executed processes of FIG. 7B and FIG. 7C can be satisfactorily executed, and a more reliable substrate can be provided. No limitations in particular are placed on the method of formation of the solder resist layer for wiring circuit protection, and a printing method, photographic method, or other well-known method can be employed. As the material of the solder resist layer for wiring circuit protection, it is desirable that a white insulating resin be used, so as to efficiently reflect light from optical semiconductor elements.

In the above-described method of manufacturing the mounting substrate of the invention, as the resin composition forming the optical reflection member, it is preferable that a thermosetting optical reflection resin composition be used which comprises, as necessary components, (A) an epoxy resin, (B) a curing agent, (C) a curing catalyst, (D) an inorganic filler, and (E) a white pigment. Details of the resin composition are as follows.

As the epoxy resin in (A), a widely used epoxy resin molding material for electronic component sealing can be used; examples include epoxified novolac resins of phenols and aldehydes, such as phenol novolac type epoxy resin or orthocresol novolac type epoxy resin; diglycidyl diethers of bisphenol A, bisphenol F, bisphenol S, and alkyl-substituted biphenol; glycidylamine type epoxy resins obtained by reacting epichlorohydrin and a polyamine such as isocyanuric acid and diaminodiphenylmethane; and linear aliphatic epoxy resins and alicyclic epoxy resins obtained by oxidizing olefin bonds with peracetic acid. Any number of these can be combined and used as appropriate.

Of these, materials with comparatively little coloring are preferable; for example, bis phenol A type epoxy resin, bis phenol F type epoxy resin, bis phenol S type epoxy resin, diglycidyl isocyanurate, and trigylcidyl isocyanurate are preferable.

As the curing agent (B), no limitations in particular are imposed so long as there is a reaction with the epoxy resin; a material with comparatively little coloring is preferable. For example, an acid anhydride curing agent, isocyanuric acid derivative, and phenol system curing agent are preferable.

As an acid anhydride curing agent, phthalic anhydride, maleic anhydride, trimellitic anhydride, pyromellitic anhydride, hexahydropthalic anhydride, tetrahydrophthalic anhydride, nadic methyl anhydride, nadic anhydride, glutaric anhydride, dimethyl glutaric anhydride, diethyl glutaric anhydride, succinic anhydride, methyl-hexahydrophthalic anhydride, and methyl-tetrahydrophthalic anhydride, can be used. As an isocyanuric acid derivative, 1,3,5-tris (1-carboxymethyl)isocyanurate, 1,3,5-tris (2-carboxyethyl)isocyanurate, 1,3,5-tris (3-carboxypropyl)isocyanurate, 1,3-bis (2-carboxyethyl)isocyanurate, and similar can be used. These may be used independently, or two or more types may be used together.

Among these curing agents, it is preferable that phthalic anhydride, trimellitic anhydride, hexahydrophthalic anhydride, tetrahydrophthalic anhydride, methyl-hexahydrophthalic anhydride, methyl-tetrahydrophthalic anhydride, glutaric anhydride, dimethyl glutaric anhydride, diethyl glutaric anhydride, or 1,3,5-tris (3-carboxypropyl)isocyanurate is used. It is preferable that the curing agents have a molecular weight of approximately 100 to 400, and that it be colorless or pale yellow.

It is preferable that the ratio of mixing of the epoxy resin (A) and the curing agent (B) is, for one unit of the epoxy group in the epoxy resin (A), 0.5 to 1.2 equivalent of the active group (anhydride group or hydroxyl group) in the curing agent (B) which can react with the epoxy group, and more preferably, 0.7 to 0.8 equivalent.

When the active group is less than 0.5 equivalent, the curing rate of the epoxy resin composition is slow, and in addition the glass transition temperature of the cured object may be low, so that adequate elasticity cannot be obtained. On the other hand, when the active group exceeds 1.2 equivalent, the strength after curing may be reduced.

As the curing accelerator (C), no limitations in particular are imposed, but for example tertiary amines such as 1,8-diaza-bicyclo (5,4,0) undecene-7, triethylene diamine and tri-2,4,6-dimethylamino methylphenol; imidazoles such as 2-ethyl-4 methyl imidazole and 2-methyl imidazole; phosphorus compounds such as triphenyl phosphine, tetraphenyl phosphonium tetraphenyl borate, tetra-n-butyl phosphonium-o,o-diethyl phosphoro-thioate, tetra-n-butyl phosphonium-terafluoro borate and tetra-n-butyl phosphonium-tetraphenyl borate; quaternary ammonium salts; metal organic salts; and derivatives of these, may be used. These may be used independently, or two or more types may be used together. Among these curing accelerators, it is preferable to use tertiary amines, imidazoles or phosphorus compounds.

It is preferable that the content of the curing accelerator (C) in the epoxy resin is from 0.01 to 8.0 by weight percent, and still more preferable that the content is 0.1 to 3.0 by weight percent. If the curing accelerator content is less than 0.01 by weight percent, an adequate curing acceleration effect may not be obtained; if the content exceeds 8.0 by weight percent, discoloration of the molded object obtained may be observed.

No limitations in particular are imposed on the inorganic filler material (D), but for example at least one material may be selected from the group comprising silica, alumina, magnesium oxide, antimony oxide, titanium oxide, zirconium oxide, aluminum hydroxide, magnesium hydroxide, barium sulfate, magnesium carbide, and barium carbide. From the standpoints of thermal conductivity, optical reflection characteristics, moldability, and flame retardation, a mixture of two or more materials among silica, alumina, magnesium oxide, antimony oxide, titanium oxide, zirconium oxide, aluminum hydroxide, and magnesium hydroxide is preferable.

No limitations in particular are imposed on the central particular diameter of the inorganic filler material (D), but it is preferable to use the inorganic filler material having a diameter in the range 1 to 100 µm, such that packing with the white pigment is efficient.

As the white pigment (E), a well-known pigment can be used; no limitations in particular are imposed, but, for example, alumina, magnesium oxide, antimony oxide, titanium oxide, zirconium oxide, and hollow inorganic particles can be used; these may be used independently, or two or more types may be combined and used.

Hollow inorganic particles may for example be silicate glass, aluminosilicate glass, borosilicate glass, shirasu glass. It is preferable that the white pigment particle diameter be such that the central particle diameter is in the range 0.1 to 50 µm. If the central particle diameter is less than 0.1 µm, particles tend to aggregate and dispersion tends to worsen; if the diameter exceeds 50 µm, there are concerns that reflection characteristics of the cured object may be inadequate.

No limitations in particular are imposed on the total mixture amounts of the inorganic filler material (D) and white pigment (E), but it is preferable that the fraction of the overall resin composition is within the range 10 to 85 by volume percent; if the fraction is less than 10 by volume percent, there are concerns that the reflection characteristics of the cured object may be inadequate, and if the fraction exceeds 85 by volume percent, moldability of the resin composition worsens and substrate manufacture tends to become difficult.

From the standpoint of improving adhesion between the epoxy resin and curing agent, and the inorganic filler material and white pigment, a coupling agent may be added to the thermosetting optical reflection resin composition used in this invention. No limitations in particular are imposed on the coupling agent, but for example, silane coupling agents and titanate coupling agents may be used. As silane coupling agents, general epoxy silane system agents, amino silane system agents, cationic silane system agents, vinyl silane system agents, acrylic silane system agents, mercapto-silane system agents, and compound systems of these, may be used in arbitrary amounts. No limitations in particular are imposed on the types of coupling agents or on treatment conditions, but it is preferable that the mixing fraction of the coupling agent with respect to the resin composition is 5 by weight percent or less.

Further, antioxidant agents, release agents, ion capture agents, or other additives may be added optionally to a resin composition of the invention.

A thermosetting optical reflection resin composition of this invention, comprising the components described above, can be pressure-molded to form a tablet at room temperature (15 to 30° C.) prior to heat curing; after heat curing, it is desirable that the optical reflectivity at wavelengths from 350 to 800 nm is 80% or higher.

For example, the above pressure molding may be performed at room temperature, applying a pressure of 5 to 50 MPa for approximately 1 to 5 seconds. If the optical reflectivity is less than 80%, there is a tendency for insufficient contribution to improvement of the brightness of the optical semiconductor device. It is still more preferable that the optical reflectivity is 90% or higher.

A thermosetting optical reflection resin composition used in this invention can be obtained by uniform dispersion and mixing of the components described above; no limitations in particular are imposed on the means and conditions thereof, but as general methods including: (molten) kneading using an extruding machine, kneader, roller, or extruder; and then cooling and crushing methods, may be used.

Conditions for (molten) kneading may be determined appropriately according to the component types and mixing quantities. No limitations in particular are imposed, but it is preferable that kneading be performed in the range 15 to 100° C. for from 5 to 40 minutes (molten), and still more preferable that kneading is performed in the range 20 to 100° C. for 10 to 30 minutes (molten). If the (molten) kneading temperature is under 15° C., (molten) kneading of each of the components is difficult, and dispersion also tends to decline. On the other hand, if 100° C. is exceeded, molecular weights in the resin composition increase, and there are concerns that the resin composition may cure.

Also, if the (molten) kneading time is under 5 minutes, the occurrence of resin burrs cannot in general be effectively suppressed, and if the time exceeds 40 minutes, polymerization of the resin composition proceeds, and there are concerns that the resin composition may cure.

A method of manufacture of an optical semiconductor device of this invention is characterized in comprising a process of forming a substrate for mounting optical semiconductor element, according to a method explained above; a process of mounting at least one optical semiconductor element on the bottom face of a depressed portion of the substrate for optical semiconductor element mounting; and, a process of forming a fluorescent material-containing transparent sealing resin layer in the depressed portion, so as to cover the mounted optical semiconductor element. By means of this invention, a thermosetting optical reflection resin composition such as described above is used to form an optical semiconductor element mounting substrate, so such problems as resin burrs, insufficient filling, and warping, which tend to occur during molding of an optical reflection member, can be reduced. As a result, by means of this invention, a large-size substrate can easily be integrally molded in which are arranged in a matrix a plurality of depressed portions serving as areas for mounting of optical semiconductor elements, so that optical semiconductor devices can be manufactured efficiently.

Figure 8:
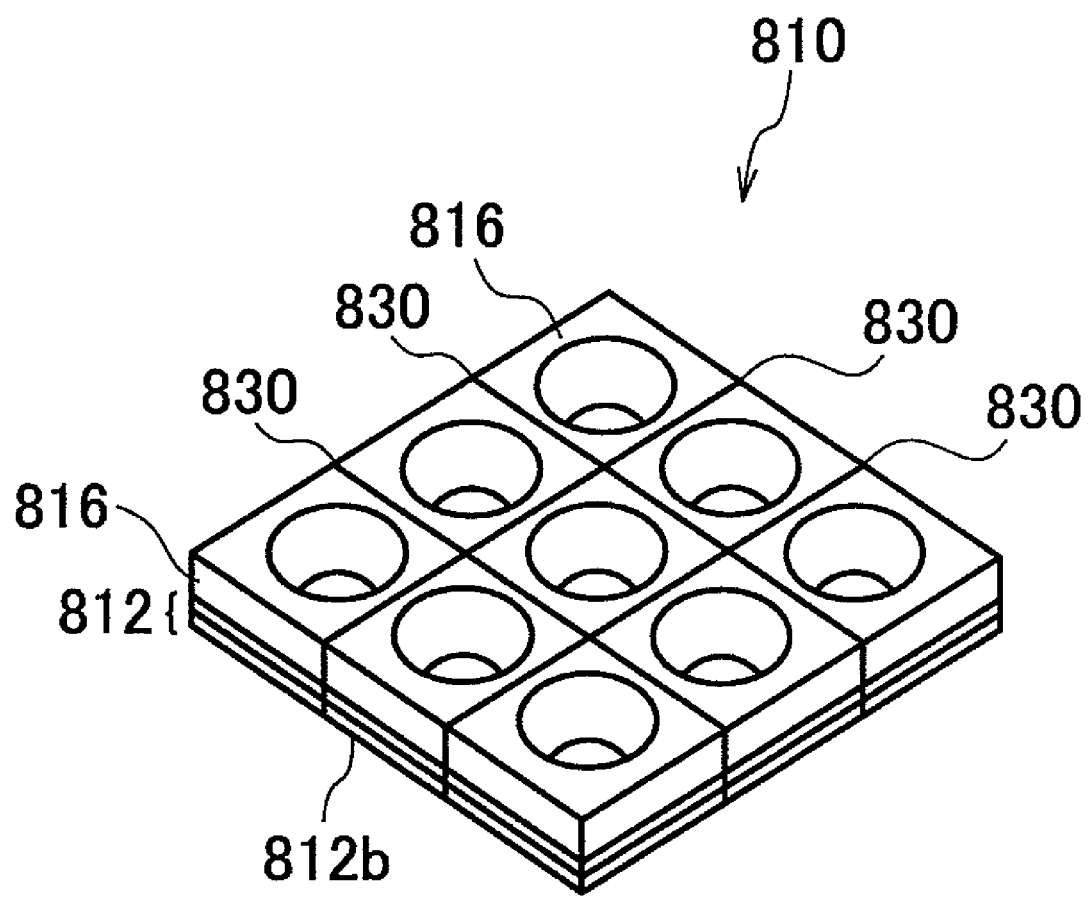

In this way, one embodiment of a method of manufacture of an optical semiconductor device of this invention is characterized in comprising a process of forming an optical semiconductor element mounting substrate having two or more depressed portions serving as areas for mounting optical semiconductor element; a process of mounting at least one optical semiconductor element in each of the depressed portions; a process of forming a fluorescent material-containing transparent sealing resin layer in the depressed portions so as to cover the optical semiconductor elements; and, a process of dividing the continuous two or more optical semiconductor devices, obtained by the preceding processes, into separate optical semiconductor devices. FIG. 8 is a perspective view showing one embodiment of an optical semiconductor element mounting substrate, which is applied to the above manufacturing method. In the figure, reference symbol 810 indicates the optical semiconductor element mounting substrate, 812 is a base substrate, 812b is an insulating layer, 816 is an optical reflection member (reflector), and 830 is a dicing line. Optical semiconductor elements are mounted in each of the depressed portions of the mounting substrate; then, the optical semiconductor elements are electrically connected to wiring circuits by bonding wires 530 see FIGS. 5A and 5B) or another well-known methods; and then, a fluorescent material-containing transparent resin layer is formed in the depressed portions, to obtain LED packages. Finally, the LED packages thus obtained are separated into a plurality of LED units by dicing in two orthogonal directions, as indicated by the reference symbols 830 in the figure. By means of this method, SMD-type LEDs having the structure shown in FIG. 5A can be efficiently manufactured. In FIG. 8, the number of LEDs obtained is nine, but the number of LEDs is not limited to this number, and may be chosen appropriately. Also, the method of device separation is not limited in particular, and laser processing, waterjet processing, die processing, or other well-known techniques can be used.

EXAMPLES

Below, examples of the invention are explained in detail; however, the invention is not limited to these examples.

Example 1

(a) Base Substrate Processing

A laminated board, MCL-E-679F (product name, manufactured by Hitachi Chemical Co., Ltd.), with he base substrate of overall thickness 0.1 mm, and copper foil on the upper face of thickness 18 μm, was used; by irradiating the lower face (insulating layer) side with a carbon dioxide gas laser, holes of diameter 1 mm were opened, the insulating layer was penetrated to reach the copper foil, and in this way ten non-penetrating holes (openings for external connection terminal formation) were formed. The processing to open holes was performed at positions directly below positions for mounting of optical semiconductor elements.

Next, a well-known subtraction method was used to pattern the copper foil, to form wiring circuits. And, by applying a white solder resist onto the wiring circuits thus formed, a board with wiring circuits, having a wiring circuit protection resist layer, was fabricated. The layer structure of the board is shown in FIG. 7A.

Next, copper, silver, aluminum, or another high-thermal conductivity material was used to form a plating layer in the interiors of each of the holes previously formed. Then, copper balls with solder coating were provided, as external connection terminals, in each of the holes covered by the plating layer.

(b) Preparation of Thermosetting Optical Reflection Resin Composition

The components were mixed with the mixing ratios indicated in Table 1, and after thorough kneading using a mixer, were melt-kneaded using a mixing roller at a temperature of 30 to 130° C. Then, the kneaded material obtained was cooled and crushed, to obtain a thermosetting optical reflection resin composition which would form the optical reflection members (reflectors) of an optical semiconductor element mounting substrate. In Table 1, the units of the mixing amounts of the components are parts by weight.

TABLE 1

| | | Description | | Mixing amounts (parts by weight) |
|---|---|---|---|---|
| Mixing component | Epoxy resin | triglycidyl isocyanurate | (*1) | 100 |
| | Curing agent | hexahydrophthalic anhydride | (*2) | 123.4 |
| | | (equivalent parts for one equivalent epoxy group) | | (0.8) |
| | Curing catalyst | tetra-n-butyl phosphonium-o,o-diethyl phosphoro-thioate | (*3) | 3.4 |

TABLE 1-continued

| | Description | | | Mixing amounts (parts by weight) |
|---|---|---|---|---|
| Coupling agent | trimethoxy epoxy silane | (*4) | | 7.0 |
| Release agent | aliphatic ester system | (*5) | | 1.0 |
| | aliphatic ether system | (*6) | | 1.0 |
| Inorganic filler material | molten spherical silica (central particle diameter 6 μm) | (*7) | | 796 |
| White pigment | hollow particles (central particle diameter 27 μm) | (*8) | | 217 |
| | alumina (central particle diameter 1 μm) | (*9) | | 705 |

(Notes)
(*1): Triglycidyl isocyanurate (100 equivalent parts epoxy; manufactured by Nissan Chemical Industries, Ltd., product name "TEPIC-S")
(*2): Hexahydrophthalic anhydride (manufactured by Wako Pure Chemical Ind., Ltd.)
(*3): Manufactured by Nippon Chemical Industrial Co., Ltd., product name "PX-4ET"
(*4): Trimethoxy epoxy silane (manufactured by Dow Corning Toray, Co., Ltd. product name "A-187")
(*5): Aliphatic esters (manufactured by Clariant, product name "Hoechst Wax E")
(*6): Aliphatic ethers (manufactured by Toyo Petrolite Co., Ltd. Ltd., product name "UNI-TOX 420")
(*7): Molten silica (manufactured by Denki Kagaku Kogyo K.K., product name "FB-301")
(*8): Hollow particles (manufactured by Sumitomo 3M Ltd., product name "S60-HS")
(*9): Alumina (manufactured by Admatechs, product name "AO-25R")

(c) Formation of Optical Reflection Member

The above-described thermosetting optical reflection resin composition was used to mold, on the base substrate comprising 18 external connection terminals fabricated in advance, a frame package, having external dimensions of 10×10×1 mm, comprising 3×3 optical semiconductor element mounting areas (depressed portions) of diameter 5 mm, for a total of nine areas, as reflection members. The molding conditions were a molding die temperature of 180° C., a molding pressure of 6.9 MPa, and a curing time of 90 seconds. After performing transfer molding under these conditions, the die was removed and post-curing was performed for 2 hours at a temperature of 150° C. In this way, the substrate for mounting optical semiconductor element shown in FIG. 8 was obtained.

Example 2

Except for using, as the base substrate, a flexible substrate comprising copper foil and a polyimide film as the insulating layer, a method entirely similar to Example 1 was used to fabricate a substrate for mounting optical semiconductor element.

Example 3

Except for using a base substrate onto which a lead frame and organic insulating layer had been bonded applying heat and pressure, a method entirely similar to Example 1 was used to fabricate a substrate for mounting optical semiconductor element.

Comparative Example 1

A substrate was prepared, comprising a lead frame, and having a configuration enabling use of one portion as an external connection terminal. Next, an optical reflection curing resin similar to that of Example 1 was used, following a similar procedure to form an optical reflection member on the lead frame, to fabricate a substrate for mounting optical semiconductor element (see FIG. 3).

Example 4

(a) Mounting an Optical Semiconductor Element

The mounting substrate fabricated in Example 1 was used, and by fixing optical semiconductor elements in depressed portions of the substrate with die bonding material intervening, and applying heat for one hour at 150° C., optical semiconductor elements were fixed to terminals of the wiring circuits. Then, metal wires were used to electrically connect optical semiconductor elements and terminals.

(b) Filling with Transparent Sealing Resin

Components were mixed according to the mixing ratio indicated in Table 2, and a well-known mixer was used to perform thorough mixing, to prepare a transparent sealing resin for use in sealing optical semiconductor elements.

TABLE 2

| | | Description | | Mixing amounts (parts by weight) |
|---|---|---|---|---|
| Mixing component | Epoxy resin | Hydrogenated bis-phenol A epoxy | (*10) | 90 |
| | | Alicyclic epoxy resin | (*11) | 10 |
| | Curing catalyst | 4-methyl hexahydrophthalic anhydride | (*12) | 90 |
| | Additives | 2,6-di-tertiary-butyl-4-methylphenol BHT | (*13) | 0.4 |
| | | 2-ethyl-4-methyl imidazole | (*14) | 0.9 |

(Notes)
(*10): Hydrogenated bis-phenol A epoxy resin (manufactured by Nagase ChemteX Corp., product name "Denacol EX252")
(*11): Alicyclic epoxy resin (manufactured by Daicel Chemical Industries, Ltd., product name "Serokisaido CEL-2021P")
(*12): Methyl hexahydrophthalic anhydride (manufactured by Hitachi Chemical Co., Ltd., product name "HN5500")
(*13): 2,6-di-tertiary-butyl-4-methylphenol BHT (manufactured by Wako Pure Chemical Ind., Ltd.)
(*14): 2-ethyl-4-methyl imidazole (manufactured by Wako Pure Chemical Ind., Ltd.)

The above-described transparent sealing resin was flowed by potting into depressed portions of the optical semiconductor element mounting substrate in which elements were previously mounted, and was cured by heat treatment at 150° C. for 2 hours.

(c) Dicing

The substrate for mounting optical semiconductor element, sealed using the transparent sealing resin, was diced along the dicing lines (see FIG. 8), to separate and obtain a plurality of optical semiconductor devices.

(d) Connection of Optical Semiconductor Devices to the Mounting Substrate

Solder-coated copper balls, provided in the openings for external connection terminal formation of the substrate for mounting optical semiconductor element, were used to connect the optical semiconductor devices and the mounting substrate by reflow treatment. The reflow conditions were a maximum temperature of 260° C. for 5 seconds, with a total reflow time of 90 seconds.

Example 5

Except for using the mounting substrate fabricated in Example 2, a method entirely similar to Example 4 was used to connect an optical semiconductor device and the mounting substrate.

Example 6

Except for using the substrate fabricated in Example 3, a method entirely similar to Example 4 was used to connect an optical semiconductor device and the mounting substrate.

Comparative Example 2

Except for using the substrate fabricated in Comparative Example 1 and employing a lead frame along the substrate side faces as an external connection terminal, a method similar to Example 4 was used to connect an optical semiconductor device and the mounting substrate.

Substrates for mounting optical semiconductor element fabricated in Examples 1 through 3 had the structure shown in FIG. 5A. On the other hand, the substrate for mounting optical semiconductor element fabricated in Comparative Example 1 had the structure shown in FIG. 3. As is clear from the figures, in the optical semiconductor devices of Examples 4 through 6, comprising the substrates of Examples 1 through 3 of this invention, the heat dissipation path is from the external connection terminals provided directly below the optical semiconductor elements, to the mounting substrate. On the other hand, in the conventional optical semiconductor device (Comparative Example 2) comprising the substrate of Comparative Example 1, the external connection terminal on the substrate face is the heat dissipation path. Hence by means of this invention, the distance between the optical semiconductor element and the external connection terminal is shorter than in a conventional device, so that the thermal resistance can be reduced. That is, by means of this invention, heat generated by an optical semiconductor element passes through the external connection terminal and is efficiently dissipated by thermal conduction, so that increases in temperature of the optical semiconductor element or optical semiconductor device can be suppressed.

In the substrates of Examples 1 through 3 of the invention, prior to formation of the reflection member comprising the thermosetting optical reflection resin by transfer molding on the substrate with wiring circuits, a wiring circuit protection resist is applied, so that such problems as insufficient filling and resin burrs, which tend to occur during molding of an optical reflection member, can be reduced, and the subsequent mounting process can be executed satisfactorily. On the other hand, in the substrate of Comparative Example 1, problems such as insufficient filling and resin burrs tend to occur during reflection member molding, so that execution of the subsequent mounting process has been difficult. Compared with the manufacturing method of this invention, it is anticipated that processes are complex and production yields are worsened, so that such conventional methods are uneconomical.

A plurality of factors may cause insufficient filling between wiring circuits during reflection member molding, such as the intervals between wiring circuit patterns and the complexity of patterns, as well as the fluidity of the resin used. However, in this invention, by using the above-described processes and resin materials, the above-described problems can be alleviated. Hence the overall number of processes to manufacture an optical semiconductor device and the number of constituent members, and similar can be reduced, so that the costs of optical semiconductor elements can be lowered.

From the above explanations, it is evident that various embodiments may be deployed over a broad range without deviating from the spirit or scope of the invention, and the invention is not limited by specific embodiments, but only by the scope of claims of the invention.

The invention claimed is:

1. A substrate for mounting an optical semiconductor element, comprising:
   a base substrate, having an insulating layer of a resin material and a plurality of wiring circuits formed on the upper face of the insulating layer, the plurality of wiring circuits being located so as to be connected to the optical semiconductor element by wire bonding, and having at least one external connection terminal formation opening portion which penetrates the insulating layer and reaches the wiring circuits; and
   an optical reflection member, which is provided on the upper face of the base substrate, and which forms at least one depressed portion serving as an area for mounting an optical semiconductor element, wherein the optical reflection member comprises a thermosetting optical reflection resin,
   wherein inner faces of the external connection terminal formation opening portion are covered with a material with high thermal conductivity, and
   wherein an external connection terminal formed in the external connection terminal formation opening portion is any one of a solder ball, solder paste, an electrode pad, and a needle-shape terminal.

2. The substrate according to claim 1, wherein at least one of the external connection terminal formation opening portions is provided directly below a mounting position of an optical semiconductor element to be mounted in the depressed portion.

3. The substrate according to claim 1, wherein said thermosetting optical reflection resin is a resin formed by curing a resin composition comprising an epoxy resin, a curing agent, a curing catalyst, an inorganic filler and a white pigment.

4. The substrate according to claim 3, wherein said resin composition further includes a coupling agent.

5. The substrate according to claim 1, wherein the thermosetting optical reflection resin has an optical reflectivity at wavelengths from 350 to 800 nm of 80% or higher.

6. The substrate according to claim 1, wherein the resin material of the insulating layer is different from the thermosetting optical reflection resin of the optical reflection member.

7. The substrate according to claim 1, wherein the insulating layer comprises a glass-reinforced resin board.

8. An optical semiconductor device, comprising:
   the substrate for mounting an optical semiconductor element according to claim 1;
   an optical semiconductor element mounted in a depressed-portion bottom face of the substrate for mounting an optical semiconductor element; and
   a fluorescent material-containing transparent sealing resin layer formed within the depressed portion so as to cover the optical semiconductor element.

9. A method of manufacturing the substrate for mounting an optical semiconductor element according to claim 1, comprising the steps of:
   forming, on a base substrate having an insulating layer and a plurality of wiring circuits formed on the upper face of the insulating layer, at least one external connection terminal formation opening portion which penetrates the insulating layer and reaches the wiring circuits; and
   forming an optical reflection member which, on the upper face of the base substrate, forms at least one depressed portion serving as an area for mounting an optical semiconductor element, wherein
   at least the inner peripheral face of the optical reflection member formed in the depressed portion is formed from a thermosetting optical reflection resin composition which has, as essential components, (A) an epoxy resin, (B) a curing agent, (C) a curing catalyst, (D) an inorganic filler material, and (E) a white pigment.

10. The method according to claim 9, wherein the optical reflection member is integrally molded by transfer molding of the thermosetting optical reflection resin composition onto the upper face of the base substrate having the plurality of wiring circuits.

11. The method according to claim 10, wherein, prior to integral molding of the optical reflection member, a solder resist layer is formed on the plurality of wiring circuits.

12. A method of manufacturing an optical semiconductor device, comprising the steps of:

mounting at least one optical semiconductor element in a depressed-portion bottom face of the substrate for mounting an optical semiconductor element according to claim 1; and forming a fluorescent material-containing transparent sealing resin layer within the depressed portion so as to cover the optical semiconductor element.

13. A method of manufacturing an optical semiconductor device, comprising the steps of:

mounting at least one optical semiconductor element in each of depressed portions of the substrate according to claim 1, the substrate being provided with at least two depressed portions;

forming a fluorescent material-containing transparent sealing resin layer in each of the depressed portions so as to cover the optical semiconductor elements; and dividing the two or more continuous optical semiconductor devices obtained in the preceding processes into separate optical semiconductor devices.

* * * * *